United States Patent
Yang et al.

(10) Patent No.: US 10,191,505 B2
(45) Date of Patent: Jan. 29, 2019

(54) HALL SENSOR CHIP WITH TIMING CONTROL

(71) Applicant: Diodes Incorporated, Plano, TX (US)

(72) Inventors: Wen-Chia Yang, Hsinchu (TW);
Khagendra Thapa, Plano, TX (US);
Ying-Tang Cho, Zhu-Bei (TW);
Ching-Yuh Tsay, Plano, TX (US);
Richard Robinson, Cheshire (GB)

(73) Assignee: Diodes Incorporated, Plano, TX (US)

( * ) Notice: Subject to any disclaimer, the term of this patent is extended or adjusted under 35 U.S.C. 154(b) by 291 days.

(21) Appl. No.: 14/929,157

(22) Filed: Oct. 30, 2015

(65) Prior Publication Data

US 2016/0132066 A1 May 12, 2016

Related U.S. Application Data

(60) Provisional application No. 62/076,858, filed on Nov. 7, 2014.

(51) Int. Cl.
G05F 1/66 (2006.01)
G01R 33/07 (2006.01)

(52) U.S. Cl.
CPC ............. *G05F 1/66* (2013.01); *G01R 33/07* (2013.01); *H03K 2217/0036* (2013.01)

(58) Field of Classification Search
CPC .............................................. H03K 2217/0036
USPC .......................................................... 307/113
See application file for complete search history.

(56) References Cited

U.S. PATENT DOCUMENTS

| | | | |
|---|---|---|---|
| 5,822,369 A | 10/1998 | Araki | |
| 5,884,894 A * | 3/1999 | Smith | F15B 9/09 137/625.64 |
| 7,768,254 B1 | 8/2010 | Michael et al. | |
| 7,994,782 B2 * | 8/2011 | Takeda | G01R 33/072 324/244 |
| 8,248,066 B2 * | 8/2012 | Han | G01R 33/072 324/117 H |
| 2007/0290701 A1 | 12/2007 | Nguyen | |
| 2008/0278891 A1 * | 11/2008 | Bidenbach | G01D 11/245 361/679.02 |
| 2011/0133723 A1 | 6/2011 | Forsyth et al. | |
| 2011/0204888 A1 * | 8/2011 | Han | G01R 33/072 324/251 |
| 2012/0153945 A1 | 6/2012 | Ezekwe | |
| 2013/0076351 A1 * | 3/2013 | Moon | G01R 33/0023 324/251 |
| 2014/0001730 A1 * | 1/2014 | Kulkarni | B60Q 1/0088 280/422 |
| 2014/0210462 A1 * | 7/2014 | Yamamoto | G01R 33/07 324/251 |
| 2015/0070007 A1 * | 3/2015 | Kurniawan | G01R 35/00 324/251 |

(Continued)

FOREIGN PATENT DOCUMENTS

EP 0620647 * 10/1994 .............. H03K 17/95

*Primary Examiner* — Adi Amrany

(57) ABSTRACT

A sensor device comprises a sensor element for measuring a stimulus and generating a corresponding signal, an ADC for convert the signal to a multi-bit digital signal, a memory unit for storing the digital signal, and a timing unit for switching off the sensor element when the ADC is converting the signal and for switching off the ADC after the digital signal is stored in the memory.

20 Claims, 2 Drawing Sheets

(56) References Cited

U.S. PATENT DOCUMENTS

2015/0358724 A1* 12/2015 Petkov .................... H04R 3/00
381/95

* cited by examiner

HALL SENSOR CHIP WITH TIMING CONTROL

BACKGROUND

Modern sensor systems, when subjected to external stimuli, produce signals that can be directly read at the output of the sensor systems, or further processed and then directed to a downstream system. The variety of stimuli modern sensor systems are designed to sense includes sound, temperature, weight, position, electric current and voltage, light, color, speed of motion, magnetic field, pressure, and geometrical shapes of two and three dimensions, foreign substances in solutions such as blood, urine, etc. Among modern sensors, Hall-effect sensors (Hall sensors) are designed to sense the presence and to measure the strength of magnetic fields, or other measurable that can be converted to magnetic field.

One type of known Hall sensor systems measures magnetic field continuously and outputs measured data continuously. With this type of Hall sensors, the sensing portion (e.g., the Hall plate) and the data processing portion of the sensor system are powered on continuously to maintain continuous measurement and output. Most linear Hall sensors belong to this type.

A second type of known Hall sensor systems measure magnetic fields sporadically or periodically. In contrast to the linear Hall sensor, this second type of Hall sensor is suitable for applications where only occasional readings of the magnetic field are required. This type of Hall sensor normally remains powered off except during the short periods when measurements are called for. During these short periods, the sensing portion and the data processing portion of the sensor are both powered on so measurement is taken and the measurement data are processed and displayed. Outside the period window, no measurement is taken and no measured information can be gleaned from the system.

SUMMARY OF THE INVENTION

Applicants studied that existing Hall sensors and noticed that they all have serious deficiencies. The first type of Hall sensor, i.e., the linear Hall sensor, is very power inefficient. Even though data output is readily available from this type of sensor, which is desirable for certain applications, the high power consumption makes this type of Hall sensor a poor choice for many battery powered applications.

The second type of Hall sensor suffers from limited data availability. Although this type is more power efficiency because the system is not powered on continuously, during power-off time, data are unavailable to the outside and that makes the sensor not suitable for many applications.

The Inventors noticed that these deficiencies not only affect the magnetic sensor systems but also many other sensor systems. In order to improve both the power efficiency and data availability, The Inventors invented a new sensor system in which the power consumption is kept very low and the measured data stay accessible until the next measurement is taken. These benefits are achieved through intelligent management of power that goes into different function blocks of the sensor system.

The invention may be understood by way of an exemplary Hall Sensor system even though it applies to many other sensor systems mentioned in the background section. The new sensor systems comprise a number of function blocks including power supply block and measurement and data processing blocks, which draw power from the power supply block at different levels.

The new Hall senor system has a Hall plate, which is a semiconductor device that measures and converts a magnetic field into a voltage signal. The signal from the Hall plate after amplification is usually analog. In order to process the signal via modern electronics, the sensor system includes an analog-to-digital converter (ADC) block that takes the analog signal and converts it into digital format. In addition, the system has a memory unit. The memory block follows the ADC and comprises of registers that hold the digital data from the converter output.

Further processing of the digital data may be required. For example, for some applications, the digital signal may need to revert back to analog form. This can be accomplished with a digital-to-analog converter (DAC) block following the ADC and memory unit.

In this exemplary sensor system, after the measurement of the magnetic field and after the voltage signal is amplified and locked in the ADC the Hall plate is turned off. Thus the Hall plate will no longer consume power while the voltage signal is processed in the ADC block.

The ADC may then be turned off after the signal conversion is completed and the digital data are stored in the memory block for direct output or to be further processed in the DAC block. Compared to the conventional linear Hall the new system consumes less than a fraction of the power. And compared to the conventional Hall switches, the new system provides information of the measure magnetic field at continuously without disruption.

DETAILED DESCRIPTION OF THE EXAMPLES

Definition of Terms

Figure 1:
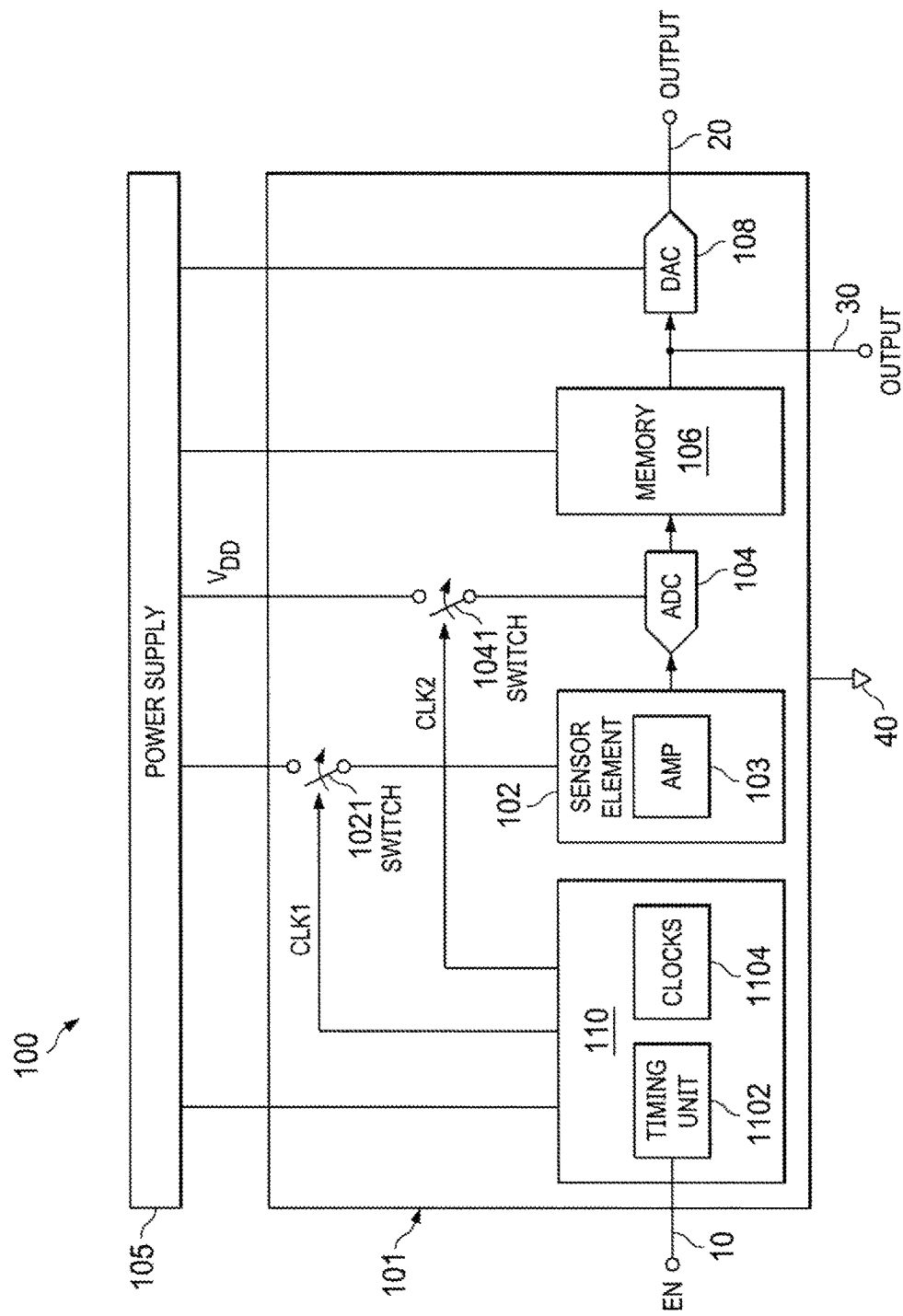
FIG. 1 is a block diagram of a sensor system that embodies this invention.

The terms used in this disclosure generally have their ordinary meanings in the art within the context of the invention. Certain terms are discussed below to provide additional guidance to the practitioners regarding the description of the invention. It will be appreciated that same thing can be said in more than one way. Consequently, alternative language and synonyms may be used A sensor element in the context of this invention means a component of a system or a device of which the purpose is to detect events or changes in the environment and to provide a corresponding output or a signal. A sensor element typically provides an electrical signal or visual indicium in response to the sensed event. Some sensor elements require power to operate such as a thermocouple, which generates a known voltage in response to temperature, a CCD in response to light, and a Hall sensor in response to a magnetic field. Others may not require power to operate, such as a mercury-in-glass thermometer, human eyes, and a compass.

An instrumentation amplifier in the context of this invention means a type of differential amplifier that is suitable for use in measurement and test equipment. It is usually a type of differential amplifier that has been outfitted with input buffer amplifiers, which eliminate the need for input impedance matching. Additional characteristics include very low DC offset, low drift, low noise, very high open-loop gain, very high common-mode rejection ratio, and very high input impedances. Instrumentation amplifiers are used where great accuracy and stability of the circuit are required. This type of amplifier is commonly used in a Hall plate sensor.

An analogue signal in the context of this invention is a continuous signal for which the time variance of the signal is a representation of some other time varying quantity.

A digital signal is a type of continuous signal that is a representation of a sequence of discrete values (a quantified signal). Digital signal is commonly synonymous to logic signal, which is a digital signal where the discrete values have two possible logic values.

An external stimulus in the context of this invention means an environment external to the sensor device that can be sensed or measured by the sensor element to produce a signal corresponding to the measured value. Example of measurable stimuli include sound, temperature, weight, position, electric current and voltage, light, color, speed of motion, magnetic field, pressure, and geometrical shapes of two and three dimensions, foreign substances in blood, urine, etc.

A signal converter in the context of this invention means an apparatus that can convert the characteristics of a signal from one representation into a different representation. In the art of electronic signal converter, the most well-known type of signal converters are analog-to-digital converter (ADC) and digital-to-analog converter (DAC).

A power supply in the context of this invention means an electronic device that supplies AC or DC power to a load. A power supply may draw its power from electrical generators, batteries, solar cells, etc. In most electronic devices, the supplied power is DC power in the form of a fixed voltage at varying current or a fixed current at varying voltage.

A memory element in the context of this invention includes electronic memory such as volatile memory such as DRAM, or non-volatile memory such as logic latches or flash memory.

A clock in the context of this invention is an electronic device that produces a periodic clock signal. A clock signal has a frequency that is defined in clock periods or cycles per second. The clock signal is usually represented by a square wave with a portion of the clock period as on-time state and the rest of the period as off-time state. The duty cycle of a clock is defined as the ratio of the on-time to the period.

To activate a device from a deactivated state in the context of this invention mean to prepare the device to perform its designed function in a system. It may be accomplished by raising the power supply voltage to the device from a reduced level to a preset level.

To deactivate a device in the context of this invention mean to suspend a device from performing its designed function temporarily for the purpose of, for example, saving power. It may be accomplished by lowering the power supply voltage to the device to below a preset level. In some cases, the preset level is zero.

To sample or sampling in the context of this invention means for the sensor element to take a measurement of a stimulus. The sampling may include measuring the magnitude of the stimulus such as temperature; or it may include measuring magnitude plus direction, such as speed, or polarity, such as magnetic field, voltage, or electric current. Sampling is usually controlled by a clock—sampling clock. The sampling rate is a determining factor of the resolution of the measurement.

EXEMPLARY EMBODIMENTS

Example One a Magnetic Field Sensor System

FIG. 1 depicts an exemplary sensor system 100 that embodies certain aspects of this invention. The sensor system comprises an integrated circuit (IC) chip 101 that includes a sensor element 102, which has a Hall Effect sensor for measuring magnetic field. In this system, the Hall Effect sensor is integrated component in the IC chip 101; in other systems the Hall Effect sensor may be a stand-alone chip. When electric current flow through the Hall Effect sensor and a magnetic field is perpendicular to the current path, the current will be deflected according to the right-hand-rule and a voltage will be generated in the sensor. The magnitude of the generated voltage and its polarity is a function of the magnitude and the direction of the current flow and the magnetic field.

In integrated circuits, the Hall Effect sensor is miniaturized and the generated voltage signal is usually small so an instrumentation amplifier 103 may need to be incorporated in the sensing element 102 to raise the signal level.

The voltage signal generated in 102 in this example is an analog signal. As depicted in FIG. 1, this signal is passed to an analog-to-digital converter (ADC) 104. The resolution of the ADC 104 is expressed in the number of bits at its output and can range from one bit to 12 bit or even higher; in this example the resolution is chosen to be 8-bits for the purpose of illustration.

Following the ADC is a memory element 106, which stores the output of the ADC 104. The memory is preferably non-volatile such as latches or EEPROMs but volatile memory such as DRAM may also be used. In some applications, the digital information stored in the memory 104 is the final output of the sensor system 100 at output 30. In other applications, when an analog output of the measured magnetic field is required, the system may optionally incorporate digital to analog converter (DAC) 108 that receives its input from the memory and converts it into an analog form at another output 20.

The system also has a timing controller element 110, which receives an Enable Signal external to the sensor system 101 at an EN pin 10 when a measurement of the magnetic field is required. The timing controller element 110 has an on/off control unit 1102, which controls the power delivered from a power supply 105, and clocks 1104 that times the on/off actions. It is the timely turning on and off of the various components in the sensor system 101 that makes the system much more power efficient as compared to the sensing systems in the known art. The function of the timing control unit 110 will be explained in the following examples.

Example Two Timing Control of a Magnetic Sensor System

Figure 2:
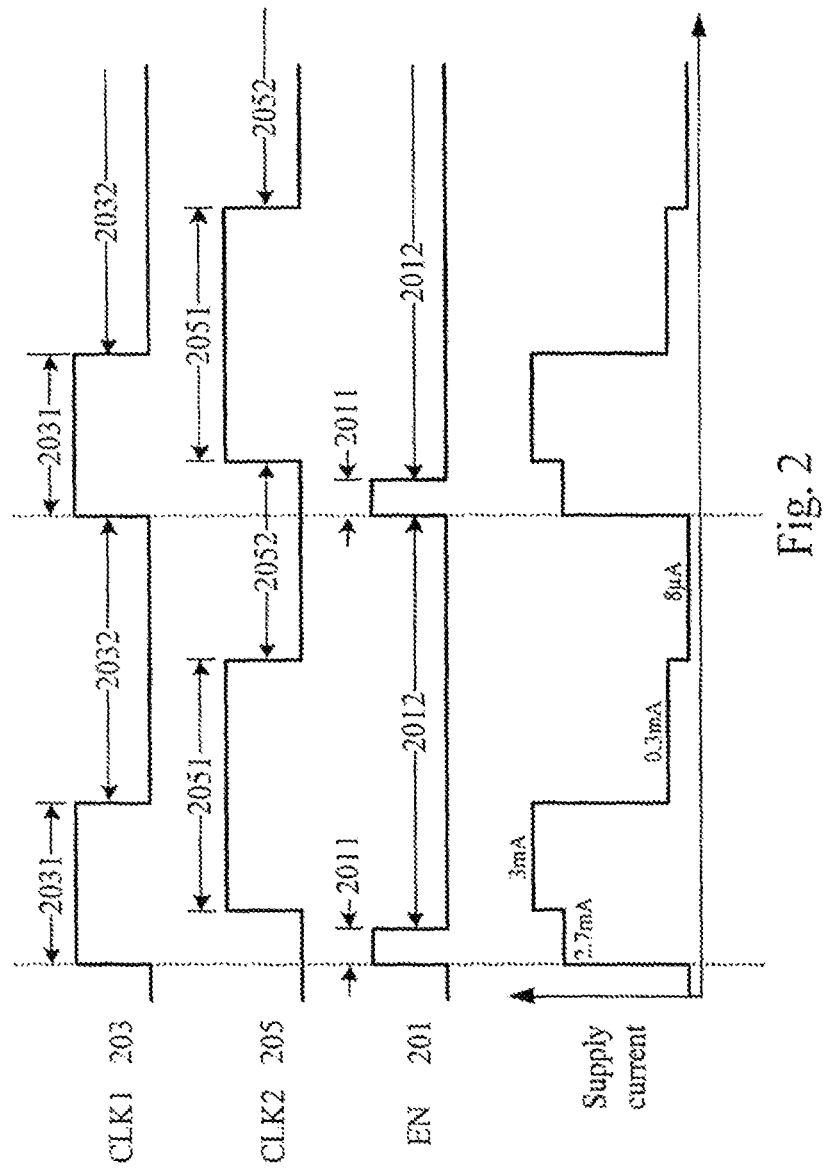
FIG. 2 is a schematic timing diagram showing operations of the sensor system of FIG. 1.

A timing control that enables a sensor system to achieve very high power efficiency is depicted in FIG. 2 and is incorporated in the exemplary magnetic sensor system 100 depicted in FIG. 1. The system activities start with an enabling (EN) clock 201. The frequency of clock 201 is dictated by how often the magnetic field needs to be measured. In this example, the raising edge of the clock 201 triggers the sensor element 102 to take measurement of the magnetic field and to present the measured information in the form of an analog voltage signal at the output of the sensor element. It is also feasible to use the falling edges of the clock 201 instead as triggers.

Upon receiving the triggering signal, the timing controller 110 generates a clock signal 203 in a clock generator 1104. The raising edge of the clock signal 203 activates the sensor element 102 to sample the magnetic field. And the duration of the clock pulse 2031 is determined by the amount of time that is necessary for the sensor element 102 to take sample or samples of the magnetic field, to amplify the generated voltage signal in the amplifier if necessary and to deliver it to the ADC 104 that follows the sensor element 102.

In this exemplary system, the current from the power supply 105 to the sensor element 102 is the about 2.7 mA, this including the biasing the Hall sensor and to power the amplifier. At the end of the clock pulse 2031, while the ADC 102 is converting the analog signal from the sensor element, a signal from the on/off controller 1102 in the timing controller 110 opens a switch 1021 and cuts off the power supplied from the power supply 105 to the sensor element 102. The switch 1021 stays open during the pulse length 2032 and little power is consumed in the sensor element 102.

The clock generator 1104 further generates a second clock signal 205 to activate the ADC 104 and put it in active mode during the pulse period 2051. The ADC 104 stays active to converts the analog signal from the sensor element 102 to a digital signal and delivers the digital data to the memory 106. In this exemplary system 100, the current to sustain the ADC in active mode is 0.3 mA. When the data is stored in the memory 104, the on/off controller 1102 sends a signal at the falling edge of the pulse 2051 to open a switch 1041 to shut off the power supplied from the power supply 105 to the ADC 104. During the pulse length 2052, the switch 1041 stays open and little power is consumed in the ADC 104.

The memory 106 now contains the information of the measurement of the magnetic field and is ready to deliver the data to the outside of the sensor system 100. Because modern memory devices are very power efficient, the memory may stay in active mode so the data stay available without disruption.

The optional DAC 108, which converts the digital data from the memory 106 into analog signal also consumes little power so in this exemplary system 100, it stays in active mode. The total power consumes by both the memory 106 and the DAC 108 is only 8 μA. It is negligible in comparison to the other components of the system. By keeping both the memory 106 and the DAC 108 active, the system can provide digital and analog data of the measured magnetic field.

What is claimed is:

1. A sensor system, comprising:
   a sensor element configured to generate a signal in response to an external stimulus;
   a first signal converter configured to receive the signal from the sensing element and to convert the signal into a multiple-bit digital signal;
   a power supply configured to supply power to the sensing element and to the converter sequentially; and
   a timing unit configured to generate an active mode of the sensor system with a first clock pulse having a first clock edge to activate the sensor element and a second clock signal edge adjacent to the first clock edge to deactivate the sensor element to reduce the supplied power to the sensor element;
   the timing unit further configured to generate a second clock pulse that overlaps the first clock pulse and having a first clock edge to activate the signal converter to receive the signal from the sensor element and a second adjacent clock edge to deactivate the signal converter; and
   the timing unit further configured to maintain activation of the signal converter after the sensing element delivers the signal to the first signal converter and after the second clock edge of the first clock signal deactivates the sensor element and ends the active model.

2. The sensor system of claim 1 further comprising a memory unit configured to store the multi-bit digital signal.

3. The sensor system of claim 2, further comprising a second clock configured to trigger a switch for switching off power from the power supply to the first signal converter after the memory unit stores the multi-bit digital signal.

4. The sensor system of claim 3, in which the sensor element comprises a Hall sensor and an amplifier.

5. The sensor system of claim 4, in which the Hall sensor, the amplifier, the first converter, the memory unit are parts of an integrated circuit chip.

6. The sensor system of claim 5, further comprising a second signal converter configured to convert the multi-bit digital signal to an analog signal.

7. The sensor system of claim 6, further comprising a first output terminal coupled to the memory unit and a second output terminal coupled to the second signal converter.

8. The sensor system of claim 7, further comprising an enabling clock configured to activate the sensor element.

9. A method of operating a sensor system, comprising:
   subjecting a sensor element to an external stimulus;
   beginning the sensor system in an active mode with a first clock edge of a first clock pulse;
   generating a signal in the sensor element in response to the external stimulus;
   activating a signal converter with a first clack edge of a second clock pulse that overlaps the first dock pulse;
   converting the signal into a multi-bit digital signal;
   deactivating the sensing element with an adjacent clock edge of the first clock pulse, ending the active mode; and
   maintaining the converted signal in the system after the ending of the active mode.

10. The method of claim 9, in which the deactivating step comprising switching off power to the sensor element.

11. The method of claim 9, further comprising storing the multi-bit digital signal in a memory unit.

12. The method of claim 11, further comprising switching off power to the converter after the multi-bit digital signal is stored in the memory unit.

13. The method of claim 9, in which the sensor element comprises a Hall sensor and an amplifier.

14. The method of claim 13, in which the generating step, the converting step, and the deactivating steps are performed in one integrated circuit chip.

15. A sensor system, comprising:
   a sensor element configured to generate a signal in response to an external stimulus;
   a signal converter configured to receive the signal from the sensor element and to convert the signal into a multiple-bit digital signal;
   a power supply;
   a timing unit configured to enable the power supply to activate the sensor system and to deactivate the sensor element with edges of a first clock pulse; and
   the timing unit further configured to enable the power supply to activate the signal converter to receive the signal from the sensor element and to deactivate the signal converter with edges of a second pulse, which overlaps the first clock pulse.

16. The sensor system of claim 15, in which the second clock pulse starts after the start of the first clock pulse and before the first clock pulse ends.

17. The sensor system of claim 15, in which the first clock pulse end after the start of the second clock pulse and before the second clock pulse ends.

18. The sensor, system of claim 15, in which the second clock pulse further activates a memory unit.

19. The sensor system of claim 18, in which the end of second clock pulse does not deactivates the memory unit.

20. The sensor system of claim 18, in which the start of the second clock pulse further activates a second signal converter, which receives a signal from the memory unit and outputs a signal in a form of the signal generated from the sensor element.

* * * * *